United States Patent [19]

Pham et al.

[11] Patent Number: 5,598,096

[45] Date of Patent: Jan. 28, 1997

[54] METHOD AND APPARATUS FOR TESTING AN INTEGRATED CIRCUIT USING CONTROLLED WIREBONDING AND WIREBONDING REMOVAL

[75] Inventors: Cuong V. Pham, Northville; Brian J. Hayden, Royal Oak; Bethany J. Walles, Birmingham; Peter R. Cibirka, Dearborn, all of Mich.

[73] Assignee: Ford Motor Company, Dearborn, Mich.

[21] Appl. No.: 348,432

[22] Filed: Dec. 2, 1994

[51] Int. Cl.⁶ .................................................. G01R 31/02
[52] U.S. Cl. ........................................ 324/158.1; 324/765
[58] Field of Search ............................. 324/765, 158.1, 324/73.1, 754; 437/8; 439/71, 69; 257/40, 48

[56] References Cited

U.S. PATENT DOCUMENTS

| | | | |
|---|---|---|---|
| 4,859,614 | 8/1989 | Sugahara et al. | 437/8 |
| 4,899,107 | 2/1990 | Corbett et al. | 324/765 |
| 5,002,895 | 3/1991 | LaParquier et al. | 437/8 |
| 5,054,193 | 10/1991 | Ohms et al. | 29/840 |
| 5,073,117 | 12/1991 | Malhi et al. | 439/71 |
| 5,149,662 | 9/1992 | Eichelberger | 437/8 |
| 5,173,451 | 12/1992 | Kinsman et al. | 437/8 |
| 5,289,631 | 3/1994 | Koopman et al. | 29/840 |
| 5,330,919 | 7/1994 | Westbrook et al. | 437/8 |
| 5,378,981 | 1/1995 | Higgins, III | 324/765 |
| 5,424,652 | 6/1995 | Hembree et al. | 324/765 |

OTHER PUBLICATIONS

IBM Microelectronics "Harmonicair™ Au Bumped Known Good Die", ©IBM Corporation 1994 (no month available).

*Primary Examiner*—Vinh P. Nguyen
*Attorney, Agent, or Firm*—Joseph W. Malleck

[57] ABSTRACT

An apparatus for testing an integrated circuit includes a bond substrate having a location for an integrated circuit. The location on the bond substrate has a plurality of traces around each location. A first fixture holds the bond substrate in a fixed relation to first fixture and holds the integrated circuit in a fixed relation to the first fixture and the bond substrate. A wirebonder forms wirebonds between the traces and the bond pads. An electrical tester provides electrical signals from the traces to the bond pads to verifying the operation of the integrated circuit. A second fixture lifts the bond substrate while the integrated circuit remains held to the first fixture. A vibrator vibrates the first fixture in relation to the second fixture so that the wirebonds are broken at a predetermined location near the bond pad.

16 Claims, 2 Drawing Sheets

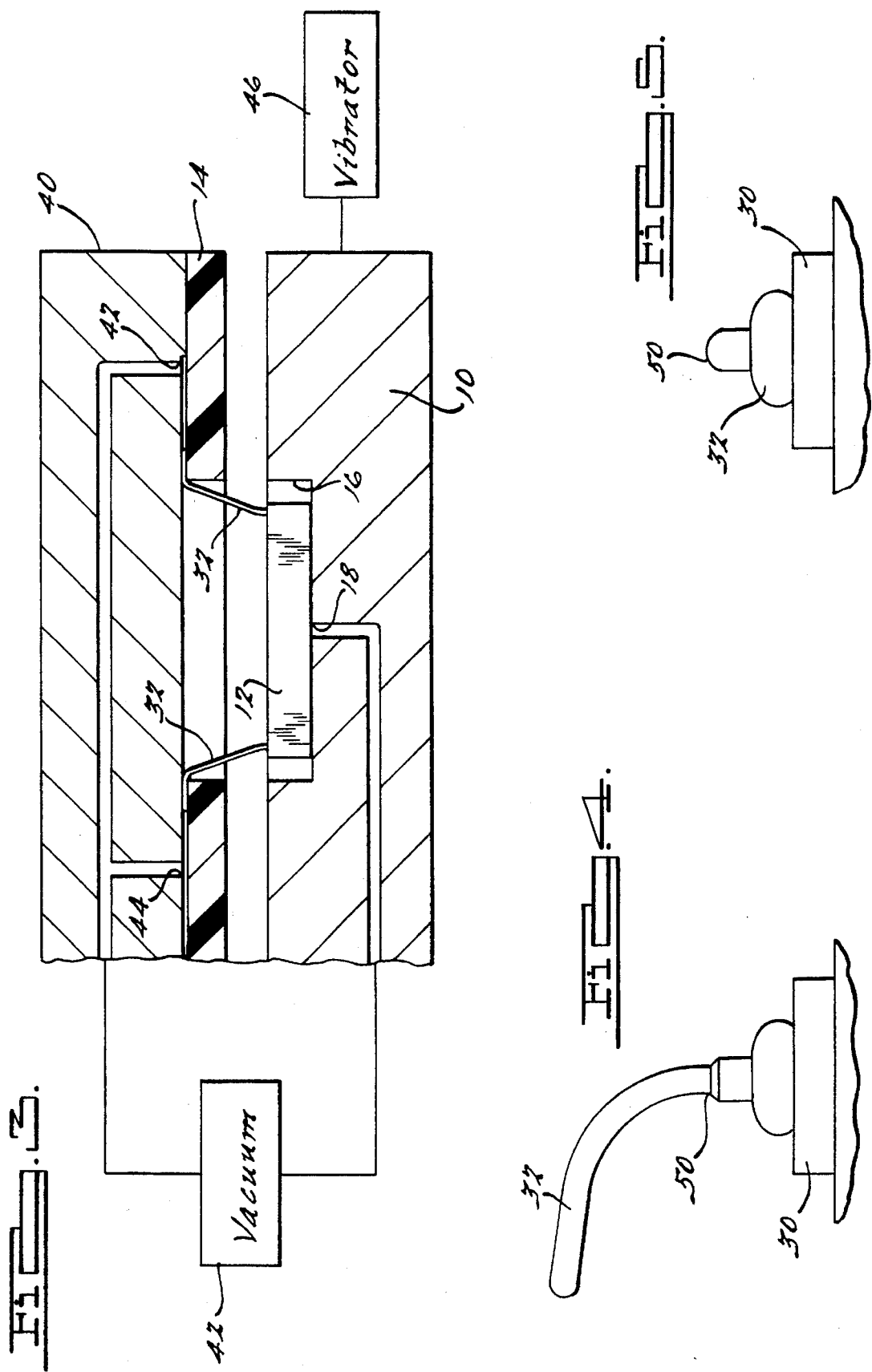

METHOD AND APPARATUS FOR TESTING AN INTEGRATED CIRCUIT USING CONTROLLED WIREBONDING AND WIREBONDING REMOVAL

BACKGROUND OF THE INVENTION

The present invention relates to the testing of bare integrated circuits through wirebonding and, more specifically, to breaking the wirebonds after testing.

Integrated circuit technology has progressed so that it is possible to mount a bare integrated circuit directly to a circuit board without enclosing it in a package having solder pins for mounting. One method of mounting a bare integrated circuit is called flip chip, which is commonly known in the art.

In using the flip chip technique, the integrated circuit is tested before installation on the circuit board. One method for testing flip chips is by wirebonding to the individual bond pads of the integrated circuits and exchanging signals between a test apparatus and the integrated circuit. One problem with testing a bare integrated circuit using wirebonding is that the wirebonds must be removed from the bond pads without damaging the integrated circuit.

One known method for removing wirebonds uses a high pressure air pulse directed at the wirebonds to break the wirebonds and remove them from the integrated circuit. This technique results in wirebonds that are broken unevenly with varying amounts of wirebond connected to the bond pads of the integrated circuit. When the integrated circuits are attached to a circuit board, the uneven wirebonds may cause electrical continuity problems at the solder joint joining the bond pad to the circuit board traces. Continuity problems occur since the uneven leads may cause the integrated circuit not to lay flat on the circuit board traces.

It would therefore be desirable to provide a method and apparatus of removing the wirebonds from an integrated circuit uniformly so that the integrated circuit can be reliably attached to a circuit board for its intended application.

SUMMARY OF THE INVENTION

One object of the invention is to advantageously provide a method for testing an integrated circuit using wirebonding while uniformly breaking the wirebonds so that the remaining portion of the wirebond can be reliably attached to the traces of a bond substrate.

The apparatus of the present invention includes a bond substrate having a location for an integrated circuit. The location on the bond substrate has a plurality of traces around each location. A first fixture holds the bond substrate in a fixed relation to first fixture and holds the integrated circuit in a fixed relation to the first fixture and the bond substrate. A wirebonder forms wirebonds between the traces and the bond pads. An electrical tester provides electrical signals from the traces to the bond pads to verifying the operation of the integrated circuit. A second fixture lifts the bond substrate while the integrated circuit remains held to the first fixture. A vibrator vibrates the first fixture in relation to the second fixture so that the wirebonds are broken at a predetermined location near the bond pad.

BRIEF DESCRIPTION OF THE DRAWINGS

FIG. 3 is a cross sectional view of an integrated circuit undergoing wirebond removal according to the present invention.

FIG. 4 is side view wirebond before undergoing wirebond removal according to the present invention.

FIG. 5 is side view wirebond after undergoing wirebond removal according to the present invention.

DETAILED DESCRIPTION OF THE PRESENT INVENTION

Figure 1:
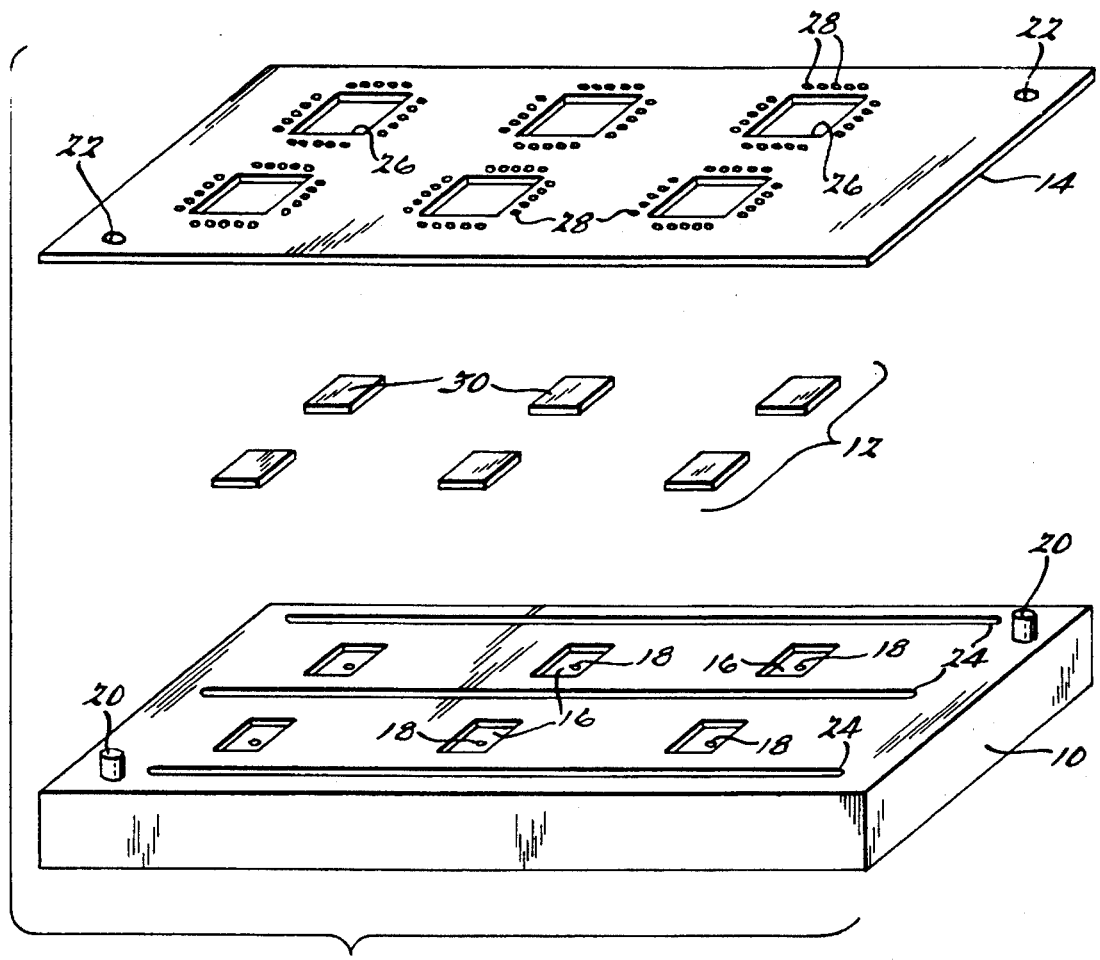
FIG. 1 is an exploded view of a bond substrate and a fixture for wirebonding according to the present invention.

Referring to FIG. 1, generally a fixture 10 secures integrated circuits 12 and a bond substrate 14 for testing using a wirebonding process. Bond substrate 14 is preferably a circuit board, lead frame or ceramic packages on a board carrier or other similar structure for testing an integrated circuit.

Fixture 10 has several integrated circuit cavities 16 for assisting in the positioning of integrated circuits 12. Cavity 16 is slightly larger than the length and width dimensions of integrated circuits by 20 to 40 mils. Cavity 16 is useful in assisting in locating integrated circuits 12 but are not essential to the invention if another scheme of accurately locating the chip on fixture 10 is employed. Fixture 10, as shown for convenience, has the capacity to hold six integrated circuits 12. However, the number of integrated circuits 12 may be varied for different requirements. Each cavity 16 has a vacuum hole 18 to fixedly secure integrated circuit to fixture 10 during wirebonding and wirebond removal.

To assist in locating bond substrate 14 in the proper location with respect to fixture 10, alignment posts 20 on fixture 10 fit into alignment holes 22 on bond substrate 14.

Fixture 10 also has a series of vacuum slots 24 by which bond substrate 14 is secured to base 10. The size and location of vacuum slots 24 provide enough force to securely hold bond substrate 14 in place during the testing process. It would be apparent to those skilled in the art, that other securing methods for securing integrated circuits 12 and bond substrate 14 such as mechanical clips may be used. Vacuum securing is the most desirable since a sufficient vacuum can be provided to hold the bond substrate securely in place.

Bond substrate 14 has a hole 26 for each of the integrated circuits 12. Holes 26 are sized slightly larger than the dimensions of integrated circuits in the length and width dimension by about 20 to 40 mils. The depth of holes 26 is preferably about the thickness of integrated circuit 12, although the depth can vary since the wirebonding process is somewhat adjustable. Holes 26 are primarily used for locating. Holes 26 have a plurality of traces 28 spaced around each hole 26. Each trace 28 is adjacent a bond pad 30 when integrated circuit 12 is placed within hole 26. Traces 28 are preferably formed of a highly electrically conductive material such as gold.

Figure 2:
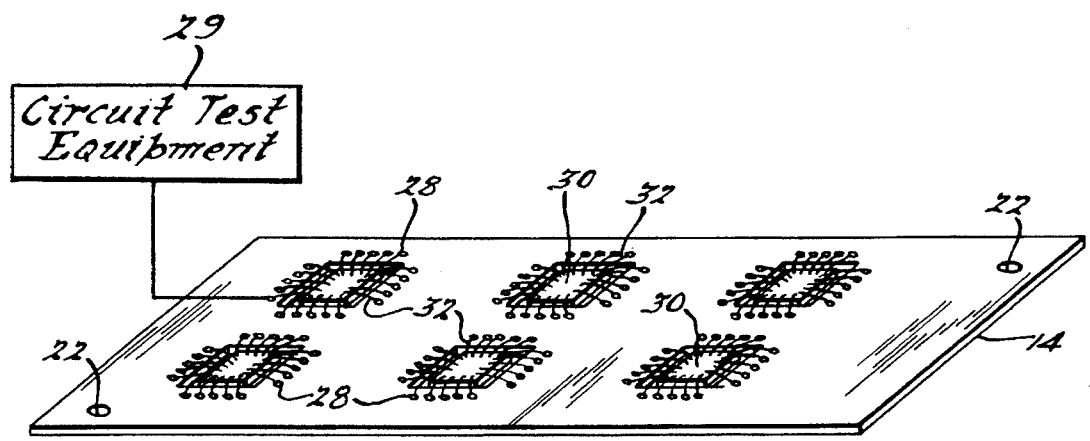
FIG. 2 is a perspective view of a wirebonded bond substrate.

Referring now to both FIGS. 1 and 2, once bond substrate 14 is secured to fixture 10 and integrated circuits 12 are secured to fixture 10, wirebonds 32 are formed between bond pads 30 and traces 28 in a conventional manner. Depending on the wirebond material, fixture 10 may be heated during the wirebond process. If aluminum wirebonds are used, no heating is required. However, if gold wirebonds are used, fixture 10 is preferably thermally conductive and is heated between 160° C. and 240° C. to ensure a good electrical connection between wirebonds 32 and traces 28.

Traces 28 are connected to circuit test equipment 29. Electrical test signals are passed to traces 28 from circuit test equipment 29, through wirebonds 32, through bond pads 30 and into integrated circuit 12 to verify the operation of integrated circuit 12. Verification preferably takes place while bond substrate 14 is secured to fixture 10. As an alternative, bond substrate 14 can be removed from fixture 10 and placed in a separate apparatus for testing.

Referring now to FIG. 3, once testing is completed on integrated circuits 12, bond substrate 14 preferably is released from fixture 10 while integrated circuit 12 remains secured via vacuum hole 18.

A second fixture 40 lifts bond substrate 14 from fixture 10 by using a vacuum 42 through vacuum holes 44.

Second fixture 40 lifts bond substrate 14 until wirebonds 32 about 5 to 10 mils. Wirebonds should not be broken during this process.

A vibrator 46 vibrates either second fixture 40 or fixture 10. Preferably fixture 10 is vibrated until wirebond 32 fatigues sufficiently to break at its weakest point. Vibrator 46 provides either linear motion or rotational motion both of which have been found to give desirable results. Vibrator 46 is preferably a motor in a cam follower configuration. Vibrator 46 may also be a transducer or other vibrating element. Typically, wirebond 32 takes between 1 and 2 seconds to break. The vibration amplitude is in the range of 5 to 10 mils using a motor and cam follower configuration with the motor rotating at 10 to 20 rpm.

Referring now to FIG. 4, a wirebond 32 is shown bonded to bond pad 30 in a conventional manner. The weakest point of wirebond 32 is at position 50. It is therefore desirable to break wirebond 32 at position 50.

In FIG. 5, wirebond 32 is shown after undergoing the above process. Wirebonds 32 consistently break at position 50. The remaining portion of wirebond 32 is used for bonding integrated circuit to a bond substrate preferably in a flip chip application. The consistent wirebonds remaining on bond pad 30 greatly improve reliability of the electrical connection when attaching the integrated circuit to a circuit board.

Various modifications will be apparent to those skilled in the art. For example, the materials, shapes and sizes of the associated components which affect the process are modifications which are all within the true spirit of the scope of the appended claims.

What is claimed is:

1. An apparatus for testing an integrated circuit having a plurality of bond pads comprising:
   a bond substrate having a location for an integrated circuit, said location having a plurality of traces around said location;
   a first fixture holding said bond substrate in a fixed relation to first fixture and holding said integrated circuit in a fixed relation to said first fixture and said bond substrate;
   wirebonding means for forming wirebonds between said traces to said bond pads;
   testing means for providing electrical signals from said traces to said bond pads for verifying said integrated circuit;
   a second fixture for lifting said bond substrate while said integrated circuit remains held to said first fixture; and
   vibration means for vibrating one of said first fixture or said second fixture so that said wirebonds are broken at a predetermined location near said bond pad.

2. An apparatus for testing an integrated circuit as recited in claim 1 further comprising first vacuum means connected to said first fixture for selectively holding said bond substrate and said integrated circuit.

3. An apparatus for testing an integrated circuit as recited in claim 1 further comprising second vacuum means connected to said first fixture for holding said bond substrate.

4. An apparatus for testing an integrated circuit as recited in claim 1 wherein said first fixture having an integrated circuit cavity.

5. An apparatus for testing an integrated circuit as recited in claim 1 wherein said first fixture is thermally conductive.

6. An apparatus for testing an integrated circuit as recited in claim 1 wherein said first fixture is aluminum.

7. An apparatus for testing an integrated circuit as recited in claim 1 wherein said vibration means includes a transducer.

8. An apparatus for testing an integrated circuit as recited in claim 1 wherein said location is a hole larger than the integrated circuit.

9. An apparatus for testing an integrated circuit as recited in claim 8 wherein said hole is about 20 to 40 mils larger than said integrated circuit.

10. An apparatus for testing an integrated circuit as recited in claim 8 wherein said hole having a depth and wherein said integrated circuit has a thickness, said depth of said hole is substantially said thickness of said integrated circuit.

11. A method of testing integrated circuits using a bond substrate having at least one hole with a plurality of traces around each hole, said method comprising the steps of:
    aligning said bond substrate on a first fixture;
    fixedly holding said bond substrate to said first fixture;
    placing an integrated circuit having a plurality of bond pads into said hole on said bond substrate;
    holding said integrated circuit to said first fixture;
    forming wirebonds between said bond pads and said bond substrate;
    verifying said integrated circuit by passing electrical signals between said traces of said bond substrate and said bond pads;
    aligning a vacuum over said bond substrate;
    releasing said bond substrate from said first fixture while holding said bond substrate with said fixture while continuously holding said integrated circuit to said first fixture;
    lifting said bond substrate from said first fixture a predetermined distance without breaking said wirebonds; and
    vibrating either said first fixture or said vacuum fixture;
    uniformly breaking said wirebonds thereby leaving uniform bumps on said bond pads of said integrated circuits.

12. A method of testing integrated circuits as recited in claim 11 wherein said steps of holding include vacuum holding.

13. A method of testing integrated circuits as recited in claim 11 wherein said steps of vibrating is comprised of moving said first fixture.

14. A method of testing integrated circuits as recited in claim 11 further comprising the steps of heating said first fixture.

15. A method of testing integrated circuits as recited in claim 11 wherein said location is a hole larger than the integrated circuit.

16. An apparatus for testing an integrated circuit having a plurality of bond pads comprising:

a bond substrate having a plurality of traces;

a first vacuum fixture holding said bond substrate in a fixed relation to first fixture and holding said integrated circuit in a fixed relation to said first fixture and said bond substrate;

wirebonding means for forming wirebonds between said traces to said bond pads;

testing means for providing electrical signals from said traces to said bond pads for verifying said integrated circuit;

a second vacuum fixture for lifting said bond substrate while said integrated circuit remains held to said first fixture; and vibration means for vibrating said first fixture or said second fixture so that said wirebonds are broken at a predetermined location near said bond pad.

* * * * *